United States Patent
Ma et al.

(10) Patent No.: US 11,177,239 B2
(45) Date of Patent: Nov. 16, 2021

(54) SEMICONDUCTOR DEVICE INCLUDING CONTROL SWITCHES TO REDUCE PIN CAPACITANCE

(71) Applicant: SANDISK INFORMATION TECHNOLOGY (SHANGHAI) CO., LTD., Shanghai (CN)

(72) Inventors: Shineng Ma, Shanghai (CN); Chin-Tien Chiu, Taichung (TW); Chih-Chin Liao, Changhua (TW); Ye Bai, Shanghai (CN); Yazhou Zhang, Shanghai (CN); Yanwen Bai, Shanghai (CN); Yangming Liu, Shanghai (CN)

(73) Assignee: SanDisk Information Technology (Shanghai) Co., Ltd., Shanghai (CN)

( * ) Notice: Subject to any disclaimer, the term of this patent is extended or adjusted under 35 U.S.C. 154(b) by 42 days.

(21) Appl. No.: 15/916,116

(22) Filed: Mar. 8, 2018

(65) Prior Publication Data
US 2019/0006320 A1    Jan. 3, 2019

(30) Foreign Application Priority Data

Jun. 29, 2017    (CN) .......................... 201710517107.7

(51) Int. Cl.
*H01L 25/065* (2006.01)
*H01H 59/00* (2006.01)
*H01L 25/18* (2006.01)

(52) U.S. Cl.
CPC ..... *H01L 25/0657* (2013.01); *H01H 59/0009* (2013.01); *H01L 25/0652* (2013.01); *H01L 25/18* (2013.01); *H01L 2224/48091* (2013.01); *H01L 2224/48227* (2013.01); *H01L 2224/48465* (2013.01); *H01L 2225/0651* (2013.01); *H01L 2225/06506* (2013.01);
(Continued)

(58) Field of Classification Search
CPC ............ H01L 25/0652; H01L 25/0655; H01L 25/0657; H01H 59/0009
See application file for complete search history.

(56) References Cited

U.S. PATENT DOCUMENTS 8,436,700 B2 * 5/2013 Schmit ............... H01H 59/0009
                                                 200/181
8,786,130 B1    7/2014 Mori et al.
(Continued)

FOREIGN PATENT DOCUMENTS

KR    10-2008-0075791    8/2008
KR    10-2012-0075882    7/2012
WO      2007130764 A1   11/2007

OTHER PUBLICATIONS

Preliminary Rejection dated Mar. 27, 2019 in Korean Patent Application No. 10-2018-0030406.
(Continued)

*Primary Examiner* — Matthew C Landau
*Assistant Examiner* — Mark Hatzilambrou
(74) *Attorney, Agent, or Firm* — Vierra Magen Marcus LLP

(57) ABSTRACT

A semiconductor device including control switches enabling a semiconductor die in a stack of semiconductor die to send or receive a signal, while electrically isolating the remaining die in the die stack. Parasitic pin cap is reduced or avoided by electrically isolating the non-enabled semiconductor die in the die stack.

19 Claims, 15 Drawing Sheets

(52) U.S. Cl.
CPC ............... *H01L 2225/06527* (2013.01); *H01L 2225/06531* (2013.01); *H01L 2225/06551* (2013.01); *H01L 2225/06562* (2013.01); *H01L 2225/06575* (2013.01); *H01L 2924/181* (2013.01)

(56) References Cited

U.S. PATENT DOCUMENTS

| | | | |
|---|---|---|---|
| 2009/0024789 A1* | 1/2009 | Rajan | G06F 1/3203 711/105 |
| 2011/0234285 A1 | 9/2011 | Kim et al. | |
| 2016/0181214 A1* | 6/2016 | Oh | H01L 45/04 257/777 |

OTHER PUBLICATIONS

Response to Preliminary Rejection (with English language summary thereof) filed May 22, 2019 in Korean Patent Application No. 10-2018-0030406.

* cited by examiner (Step 202)

SEMICONDUCTOR DEVICE INCLUDING CONTROL SWITCHES TO REDUCE PIN CAPACITANCE

BACKGROUND

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

While many varied packaging configurations are known, flash memory storage cards may in general be fabricated as system-in-a-package (SiP) or multichip modules (MCM), where a plurality of die are mounted and interconnected on a small footprint substrate. The substrate may in general include a rigid, dielectric base having a conductive layer etched on one or both sides. Electrical connections are formed between the die and the conductive layer(s), and the conductive layer(s) provide an electric lead structure for connection of the die to a host device. Once electrical connections between the die and substrate are made, the assembly is then typically encased in a molding compound which provides a protective package.

In order to most efficiently use package footprint, it is known to stack semiconductor die on top of each other on a substrate. In order to provide access to bond pads on the semiconductor die, the die are stacked, either completely overlapping each other with a spacer layer in between adjacent die, or with an offset. In an offset configuration, a die is stacked on top of another die so that the bond pads of the lower die are left exposed. The die are then wire bonded to each other and to the substrate, using for example a vertical column of wire bonds to corresponding die pads on each die in the stack. For example, the pin P0 on each die in the stack are wire bonded to each other and the substrate using a vertical column of wire bonds, the pin P1 on each die in the stack are wire bonded to each other and the substrate, etc., across all of the die bond pads of the die in the stack.

Conventionally, signals are sent to a particular pin on a particular die by a controller die sending the signal to the die stack along a selected vertical column of wire bonds so that the corresponding pins on all die in the stack receive the signal. The controller also sends a chip enable signal, which enables one of the die in the die stack, while all other die in the stack remain on standby, so that the signal is communicated at the selected pin only within the enabled die.

One problem with the structure and operation of the above-described conventional semiconductor device is that the pins in the die stack receiving the signal when on standby cause parasitic capacitance, also referred to as "pin cap." This pin cap results in unnecessary power consumption and limits input/output (I/O) signal transfer speed. As the number of die in present day die stacks continues to increase, the problems associated with pin cap are getting worse.

DETAILED DESCRIPTION

The present technology will now be described with reference to the figures, which in embodiments, relate to a semiconductor device including control switches enabling a semiconductor die in a stack of semiconductor die to send or receive a signal, while electrically isolating the remaining die in the die stack. Parasitic pin cap is reduced or avoided by electrically isolating the non-enabled semiconductor die in the die stack. In embodiments, the control switches may be formed as micro-electromechanical (MEMS) devices on a substrate supporting the die stack. The control switches may also be formed as MEMS devices on a sidewall of a three-dimensional block of semiconductor die. In further embodiments, the control switches may be incorporated as integrated circuits within an interface chip.

It is understood that the present technology may be embodied in many different forms and should not be construed as being limited to the embodiments set forth herein.

Rather, these embodiments are provided so that this disclosure will be thorough and complete and will fully convey the technology to those skilled in the art. Indeed, the technology is intended to cover alternatives, modifications and equivalents of these embodiments, which are included within the scope and spirit of the technology as defined by the appended claims. Furthermore, in the following detailed description of the present technology, numerous specific details are set forth in order to provide a thorough understanding of the present technology. However, it will be clear to those of ordinary skill in the art that the present technology may be practiced without such specific details.

The terms "top" and "bottom," "upper" and "lower" and "vertical" and "horizontal" as may be used herein are by way of example and illustrative purposes only, and are not meant to limit the description of the technology inasmuch as the referenced item can be exchanged in position and orientation. Also, as used herein, the terms "substantially," "approximately" and/or "about" mean that the specified dimension or parameter may be varied within an acceptable manufacturing tolerance for a given application. In one embodiment, the acceptable manufacturing tolerance is ±0.25%.

An embodiment of the present technology will now be explained with reference to the flowchart of FIGS. 1 and 4, and the top, side and perspective views of FIGS. 2-3 and 5A through 22. Although the figures show an individual semiconductor device 100, or a portion thereof, it is understood that the device 100 may be batch processed along with a plurality of other packages on substrate panels to achieve economies of scale. The number of rows and columns of devices 100 on the substrate panels may vary.

Figure 2:
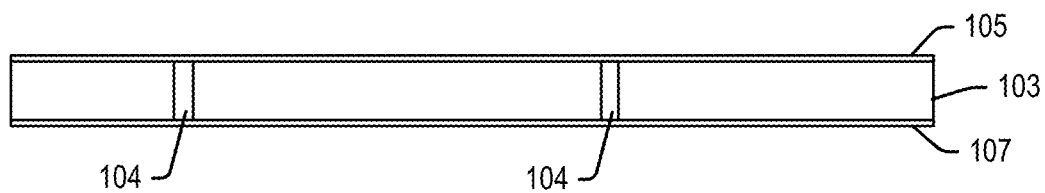
FIG. 2 is a side view of a substrate of a semiconductor device at a first step in the fabrication process according to an embodiment of the present technology.
Figure 3:
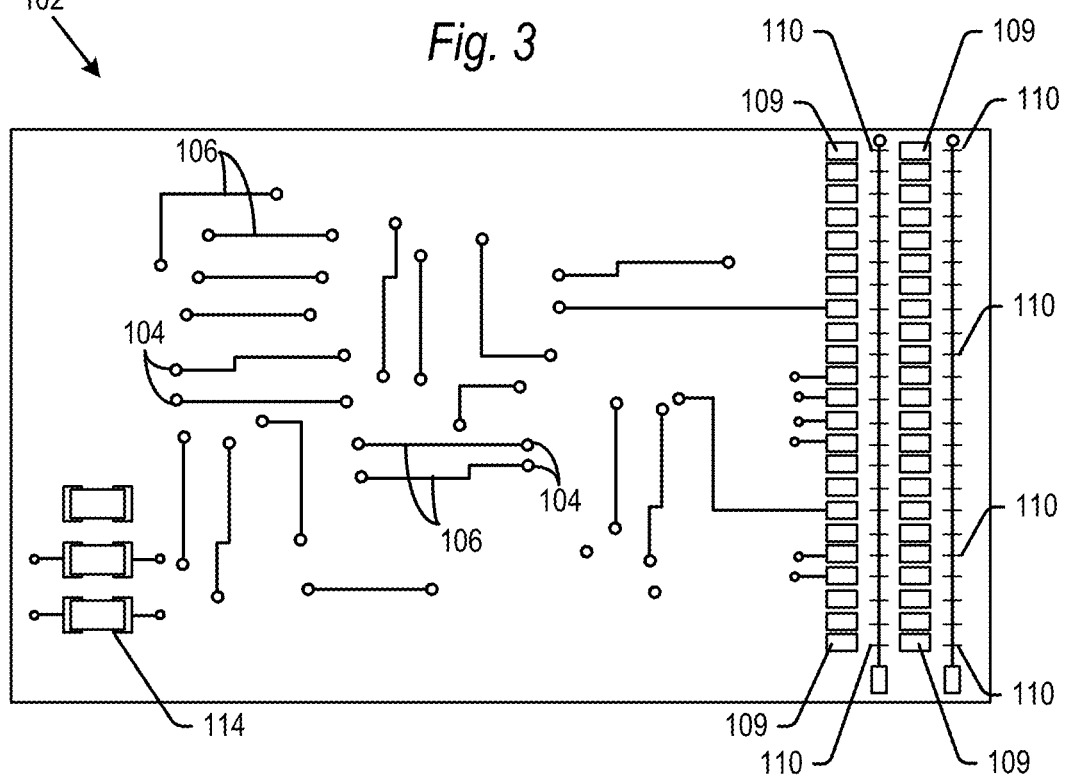
FIG. 3 is a top view of a substrate of a semiconductor device at a second step in the fabrication process according to an embodiment of the present technology.

The substrate panel for the fabrication of semiconductor device 100 begins with a plurality of substrates 102 (again, one such substrate is shown in FIGS. 2-3). The substrate 102 may be a variety of different chip carrier mediums, including a printed circuit board (PCB), a leadframe or a tape automated bonded (TAB) tape. Where substrate 102 is a PCB, the substrate may be formed of a core 103 having a top conductive layer 105 and a bottom conductive layer 107 as shown in FIG. 2. The core 103 may be formed of various dielectric materials such as for example, polyimide laminates, epoxy resins including FR4 and FR5, bismaleimide triazine (BT), and the like. The core may have a thickness of between 40 microns (μm) to 200 μm, although the thickness of the core may vary outside of that range in alternative embodiments. The core 103 may be ceramic or organic in alternative embodiments.

The conductive layers 105, 107 surrounding the core may be formed of copper or copper alloys, plated copper or plated copper alloys, Alloy 42 (42Fe/58Ni), copper plated steel, or other metals and materials suitable for use on substrate panels. The conductive layers may have a thickness of about 10 μm to 25 μm, although the thickness of the layers may vary outside of that range in alternative embodiments.

Figure 1:
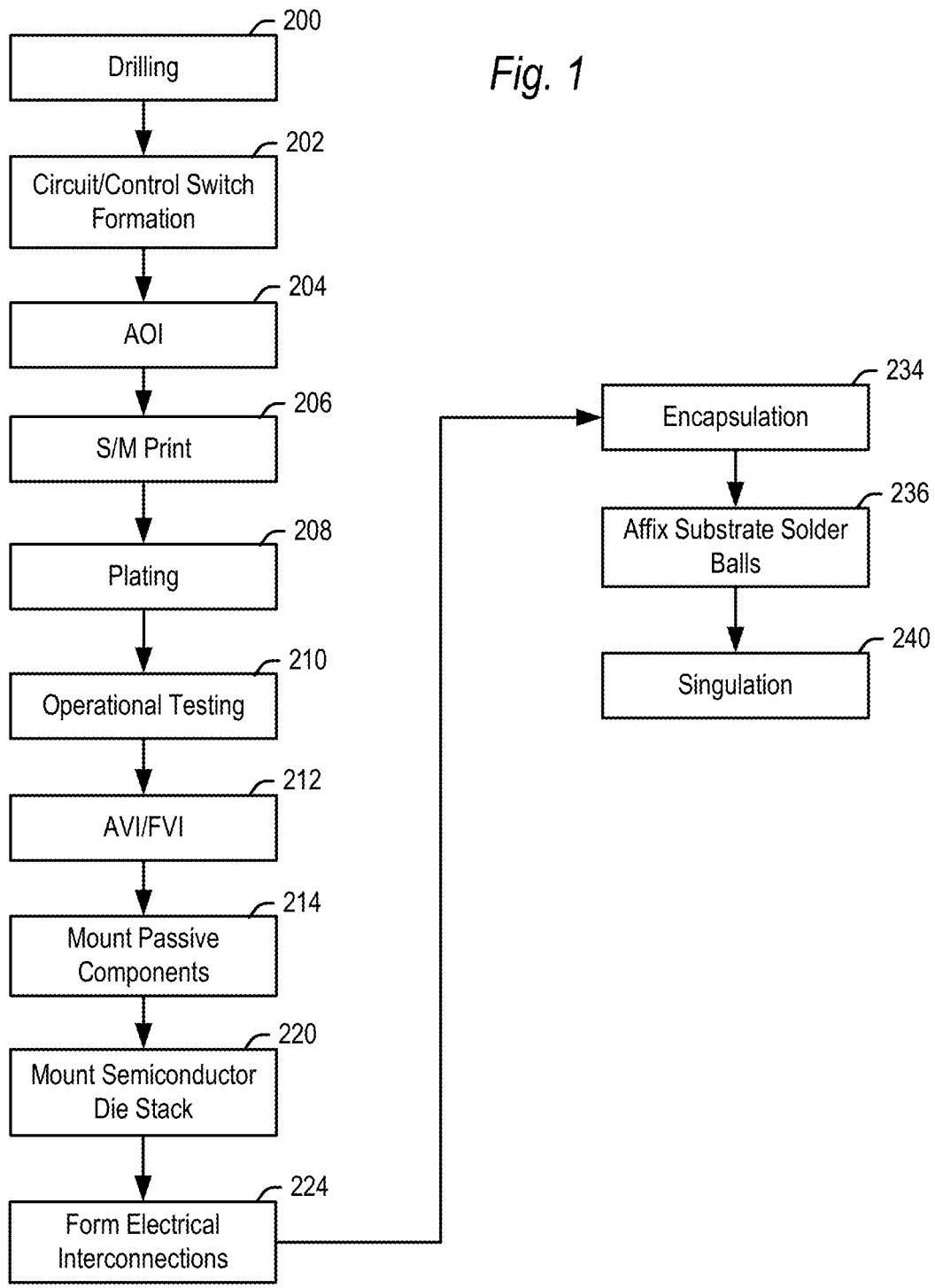
FIG. 1 is a flowchart of the overall fabrication process of semiconductor device according to embodiments of the present technology.

FIG. 1 is a flowchart of the fabrication process for forming a semiconductor device 100 according to embodiments of the present technology. In a step 200, the substrate 102 of a first semiconductor device 100 may be drilled to define through-hole vias 104 in the substrate 102. The vias 104 shown are by way of example, and the substrate 102 may include many more vias 104 than as shown in the figures, and they may be in different locations than as shown in the figures. Conductance patterns are next formed on one or both of the top and bottom conductive layers in step 202. The conductance pattern(s) may include electrical traces 106, contact pads 109 on a top surface of the substrate and contact pads 108 on a bottom surface of the substrate as shown for example in FIGS. 2 and 3. The traces 106 and contact pads 109, 108 (only some of which are numbered in the figures) are by way of example, and the substrate 102 may include more traces and/or contact pads than is shown in the figures, and they may be in different locations than is shown in the figures.

In accordance with aspects of the present technology, a number of control switches 110 may also be defined in a surface of the substrate as MEMS devices in step 202. Such control switches 110 are shown for example in FIG. 3, and explained in greater detail with respect to the flowchart of FIG. 4 and views of FIGS. 5A-5I. In embodiments, there is a control switch 110 associated with each contact pad 109 formed on the substrate 102. It is conceivable that the substrate 102 includes contact pads 109 that do not get used (i.e., do not get wire bonded to a semiconductor die as explained below). In such embodiments, there may be a control switch 110 associated with each contact pad 109 that gets wire bonded to a semiconductor die.

FIG. 2 shows two rows of contact pads 109 and an associated two rows of control switches 110, with a one-to-one correspondence between contact pads 109 and control switches 110. The contact pads 109 and control switches 110 may be provided in a wide variety of other configurations in further embodiments. In one example, there are as many contact pads 109 and control switches 110 as there are die bond pads in the stack of semiconductor die mounted on the substrate as explained below. Moreover, a control switch 110 need not be directly adjacent its associated contact pad 109 in further embodiments.

Figure 4:
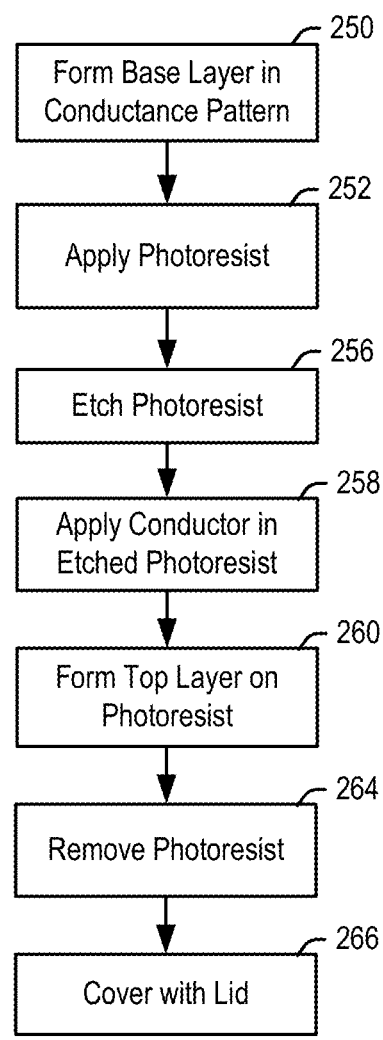
FIG. 4 is a flowchart showing further detail of step 202 for forming the control switches on a surface of the substrate.
Figure 5A:
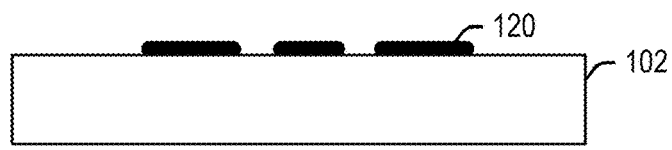
FIGS. 5A-5I are side and perspective views of a control switch at various stages of fabrication.
Figure 5B:
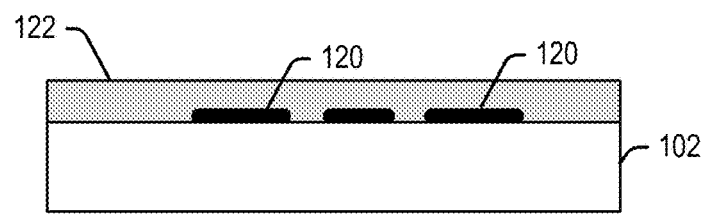
Figure 5C:
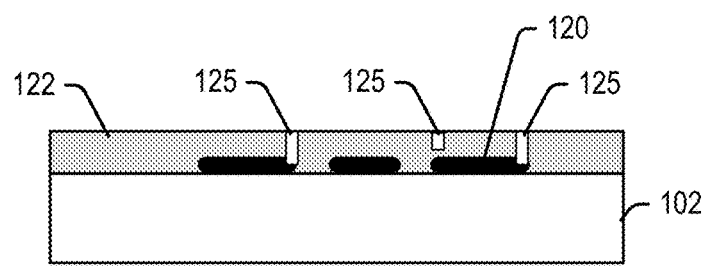

Referring now to the flowchart of FIG. 4, in step 250, a base layer 120 of a switch 110 is defined in the conductance pattern as shown in the edge view of FIG. 5A. As noted above, the conductance pattern may be photolithographically formed in metal layer 105 on a surface of the substrate 102. In step 252, a layer of photoresist 122 may be formed over the base layer 120 on the substrate 102 as shown in the edge view of FIG. 5B. The photoresist layer 122 may be formed over the entire surface of the substrate 102, or only in the area of the substrate 102 to include control switches 110.

Figure 5D:
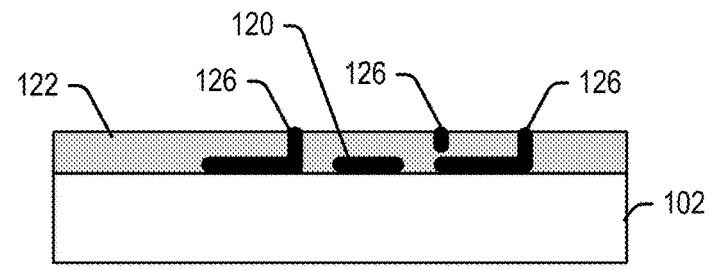
Figure 5E:
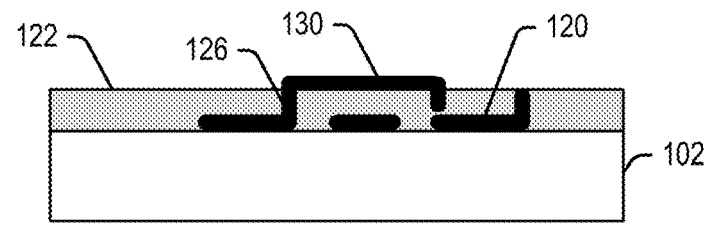

In step 256, portions of the photoresist may be etched to define openings 125 down to the service of the photoresist 122 (FIG. 5C), which openings may be filled with the conductive material 126 such as copper or copper alloy in step 258 (FIG. 5D). In step 250, a top layer 130 may be formed on a surface of the photoresist layer 122, as shown in the edge view of FIG. 5E, connecting portions of the conductive material 126. In step 264, the photoresist layer 122 chemically removed as shown in the edge view of FIG. 5F and the perspective view of FIG. 5G.

Figure 5F:
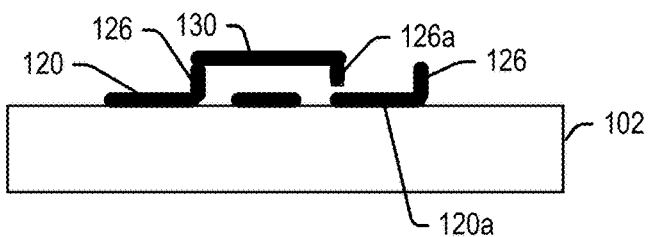
Figure 5G:
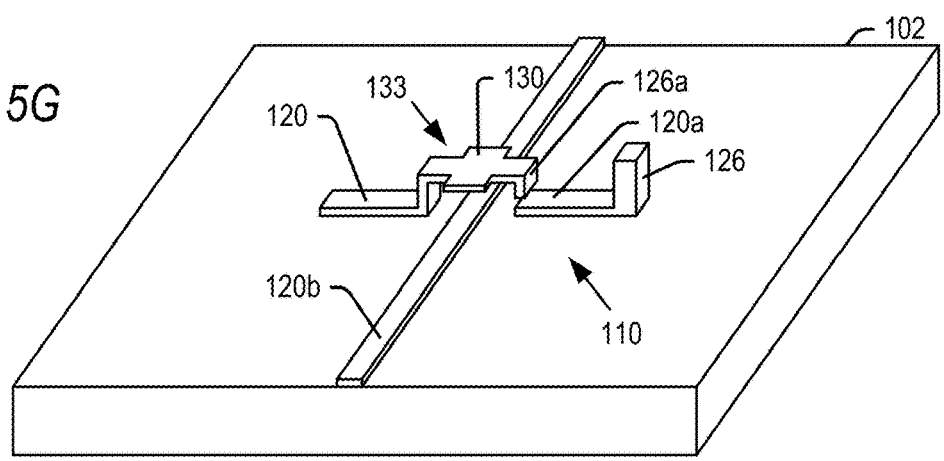

As seen in FIGS. 5F-G, a portion of the conducting material 126, specifically conducting material portion 126a, does not extend all the way into contact with a portion 120a of the base layer 120. In embodiments, the end of portion 126a may be spaced 1 to 3 μm above the portion 120a. This defines a flexible cantilevered portion 133 of the switch 110. In embodiments, the top layer 130 may be 5-10 μm above the surface of substrate 102.

While FIGS. 5A-5G show a single control switch 110, it is understood that all of the control switches 110 on the surface of substrate 102 may be batched processed simultaneously in the above steps. As best seen in the perspective view of FIG. 5G, a portion of the base layer 120, specifically portion 120b, may run through a plurality of switches 110, beneath the top layer 130 which is cantilevered above the surface of the substrate 102.

As explained below, the portion 120b may form a control trace for activating/deactivating all of the control switches 110 through which a control trace 120b passes. In particular, passing current through the control trace 120b in a particular direction will generate a magnetic field between the trace 120b and the cantilevered portion 133. As a cantilevered portion 133 is flexible, the magnetic force will pull the cantilevered portion 133 toward the trace 120, causing contact between conducting material portion 126a and base portion 120a, thus closing the control switch 110 and allowing signals and other voltages to pass across a switch 110.

In the embodiments shown, the portion 126a is spaced from the portion 120a, so that the switch is in an open state in an unbiased position (i.e., in the absence of a voltage along control trace 120b). In an alternative embodiment, it is conceivable that the portion 126a rests against the portion 120a in an unbiased position. In this alternative embodiment, the control switch 110 would be in a closed state in an unbiased position. A voltage in the proper direction along control trace 120b would bias the cantilevered portion 133 away from the control trace 120b, thus opening the control switch 110. The chip enable signals described below for enabling one die in the stack would be toggled in this alternative embodiment.

Figure 5H:
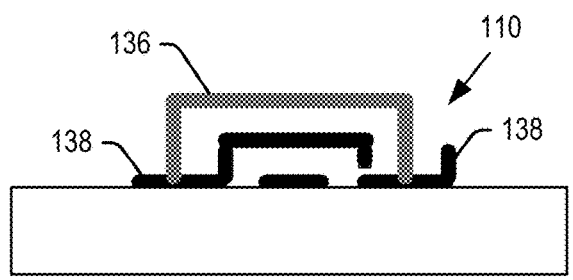
Figure 5I:
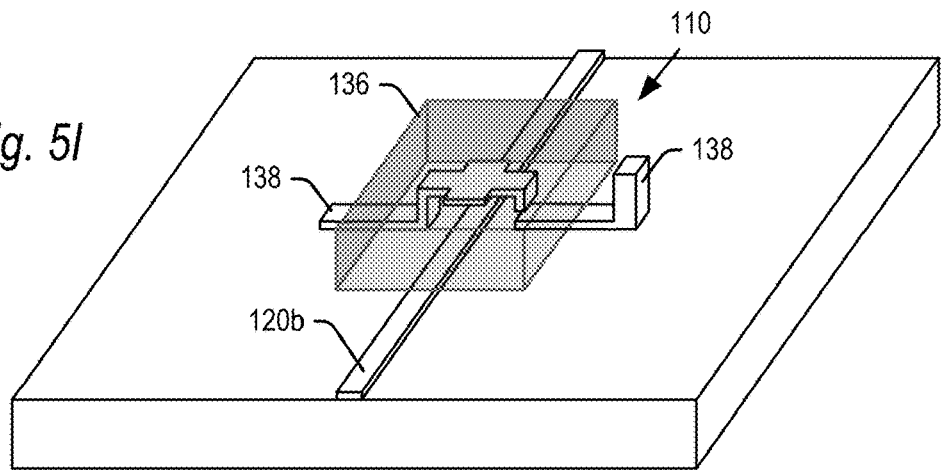
Figure 6:
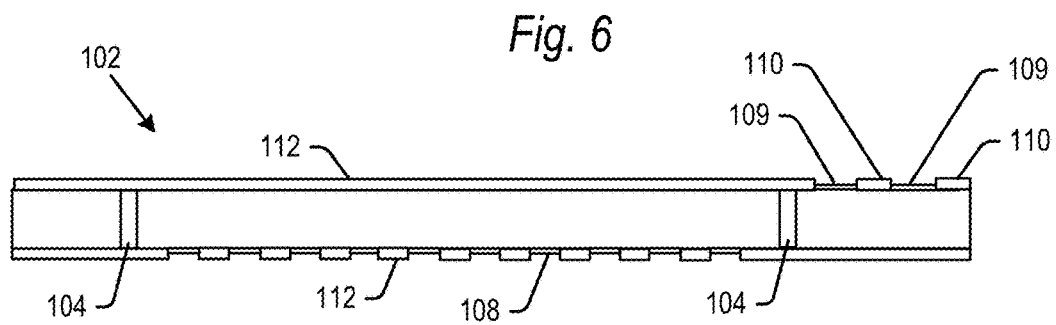
FIG. 6 is a side view of a substrate including control switches according to embodiments of the present technology.

Referring again to the flowchart of FIG. 4, the control switch 110 may be encased in a cover 136 as shown in the edge view of FIG. 5H and the perspective view of FIG. 5I. The cover 136 may be formed of an electrically insulative material, such as for example silicon, silicon dioxide or some other dielectric material. The cover 136 may be affixed to the surface of the substrate 102 with an adhesive, such as for example die attach film. Portions of the control switch 110, referred to herein as I/O pins 138, extend outside of the cover 136. The I/O pin 138 on a first side of the control switch is electrically connected to a contact pad 109. The I/O pin 138 on the second side of the switch is routed through the substrate 102 to electrically connect with a control die as explained below.

In one embodiment, the substrate 102 may include one or more rows of contact pads 109 and control switches 110 along a single edge of the substrate. In further embodiments, there may be rows of contact pads 109 and control switches 110 at opposed edges of the substrate 102. In further embodiments, contact pads 109 and control switches 110 may be provided around three edges or all four edges of the substrate. Further embodiments may employ a multi-layer substrate, which include internal conductance patterns in addition to those on the top and/or bottom surfaces.

While the figures such as FIG. 3 shows the control switches 110 directly adjacent to their associated contact pad 109, it is understood that the conductance pattern formed on, under and/or within the substrate 102 may allow a control switch 110 to be spaced away from its associated contact pad 109 on the substrate 102 as noted above. In such embodiments, a control switch 110 may be on the same surface of the substrate 102 as its associated contact pad 109, or the control switch 110 and its associated contact pad 109 may be on opposite surfaces of the substrate 102.

In various embodiments, the finished semiconductor device may be used as a BGA (ball grid array) package. For such embodiments, a lower surface of the substrate 102 may include contact pads 108 for receiving solder balls. In various embodiments, the finished semiconductor device 180 may be an LGA (land grid array) package including contact fingers for removably coupling the finished device 180 within a host device. In such embodiments, the lower surface may include contact fingers instead of the contact pads that receive solder balls. The conductance pattern on the top and/or bottom surfaces of the substrate 102 may be formed by a variety of suitable processes, including for example various photolithographic processes.

Referring again to FIG. 1, the substrate 102 may next be inspected in step 204. This step may include an automatic optical inspection (AOI). Once inspected, a solder mask 112 (FIG. 6) may be applied to the upper and/or lower surfaces of the substrate in step 206. After the solder mask is applied, the contact pads, and any other areas to be soldered on the conductance patterns may be plated, for example, with a Ni/Au, Alloy 42, or the like, in step 208 in a known electroplating or thin film deposition process. The substrate 102 may next undergo operational testing in step 210. This step may include the testing of each of the control switches 110 formed on the substrate 102 as described above. In step 212, the substrate may be visually inspected, including for example an automated visual inspection (AVI) and a final visual inspection (FVI) to check for contamination, scratches and discoloration. One or more of these steps may be omitted or performed in a different order.

Assuming the substrate 102 passes inspection (including the operation of the control switches 110), passive components 114 (FIG. 3) may next be affixed to the substrate 102 in a step 214. The one or more passive components may include for example one or more capacitors, resistors and/or inductors, though other components are contemplated. The passive components 114 shown are by way of example only, and the number, type and position may vary in further embodiments.

Figure 7:
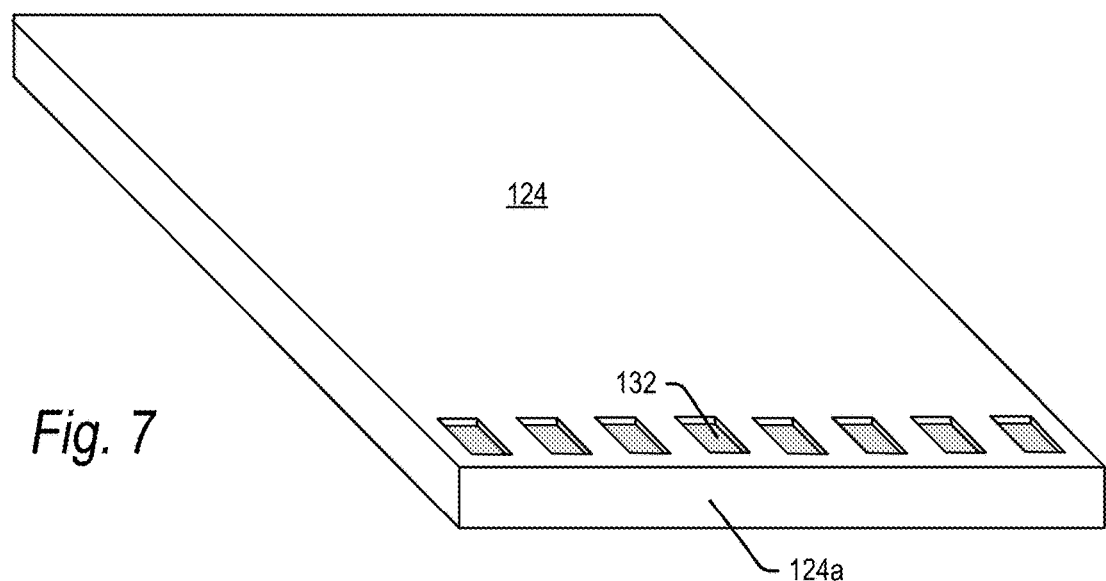
FIG. 7 is a perspective view of a semiconductor die used in the semiconductor device of the present technology.

In step 220, a number of semiconductor die may next be stacked on the substrate 102. FIG. 7 illustrates an example of a semiconductor die 124 which may be used. The semiconductor die 124 may for example be memory die such a NAND flash memory die, but other types of die 124 may be used. These other types of semiconductor die include but are not limited to controller die such as an ASIC, or RAM such as an SDRAM. The semiconductor die 124 may further alternatively be used to form device 100 into a power semiconductor device such as for example a switch or rectifier.

Each semiconductor die 124 may include a number of die bond pads 132 formed at or near an edge 124a of the semiconductor die 124. In order to form the die bond pads 132 at the edge 124a, the wafer scribe lines may be defined on the surface of the wafer so as to intersect the die bond pads 132. When the wafer is diced along the scribe lines, the cut is made through the die bond pads on each semiconductor die, resulting in the die bond pads 132 terminating at the edge of the semiconductor die 124. The scribe lines may alternatively be formed outside of the footprint of the die bond pads 132, in which case the die bond pads may be spaced slightly from the edge 124a when the wafer is diced.

Figure 8:
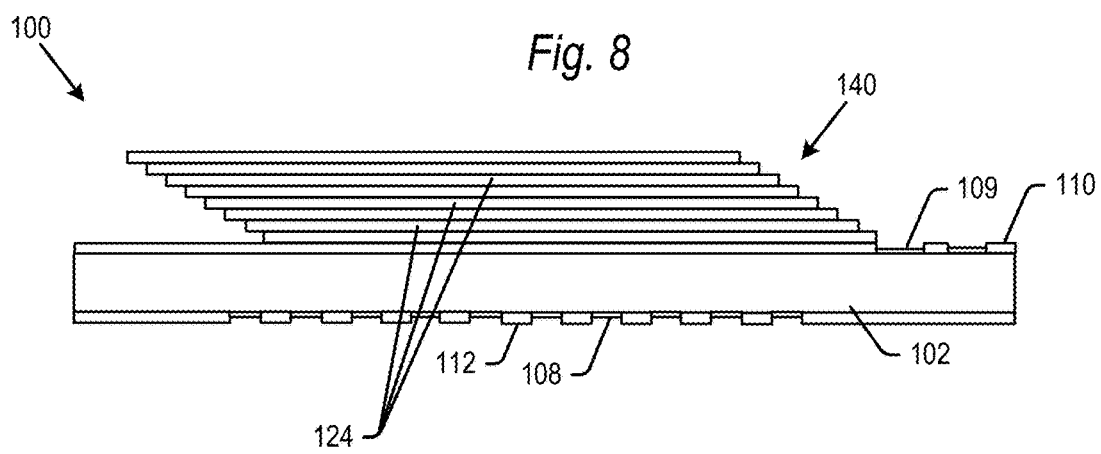
FIG. 8 is a side view of a number of semiconductor die mounted on a substrate according to an embodiment of the present technology.
Figure 16:
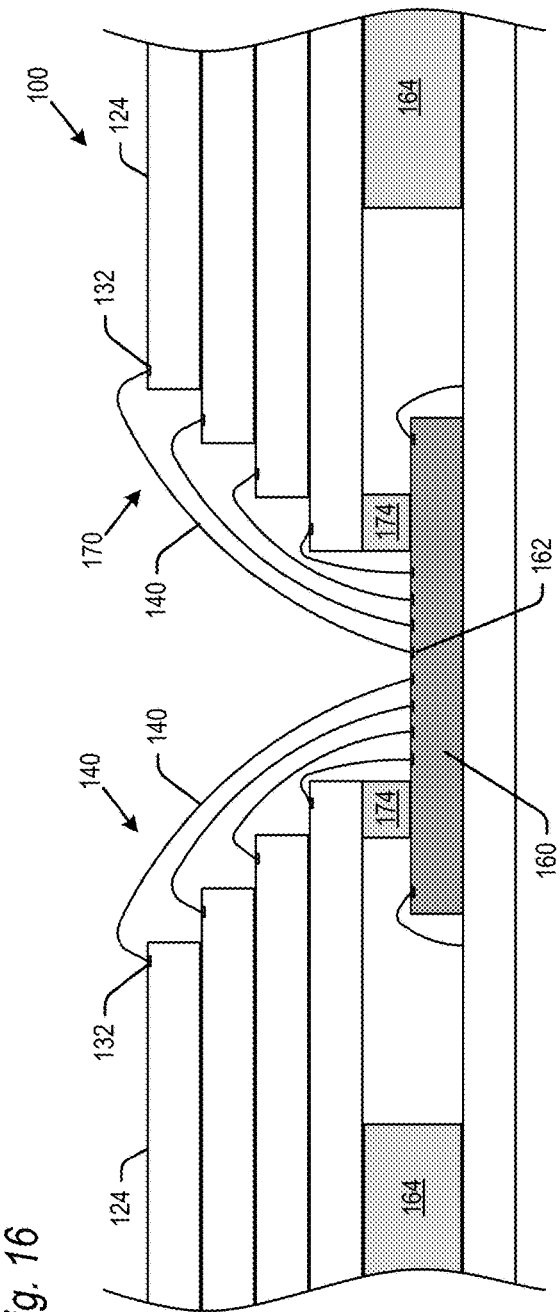
FIG. 16 is a side view of a further alternative embodiment of the present technology including an interface chip and a pair of die stacks.

In embodiments, each die bond pad 132 may have a length and width of approximately 70 µm, though the length and width may vary in further embodiments, proportionately or disproportionately to each other. There may be more die bond pads 132 than are shown in FIG. 7, and the die bond pads may be formed along more than one edge of the semiconductor die 124 in further embodiments. The semiconductor die 124 may be diced from the wafer by any of various dicing technologies, including for example by stealth dicing before grinding, saw, laser or waterjet cutting methods. In stealth dicing before grinding, a laser makes pinpoint holes beneath the surface of the wafer, which holes result in cracks which propagate to the upper and lower surfaces of the wafer, for example during the wafer backgrind step, for precise dicing of the wafer. It is understood that the wafer may be diced to produce semiconductor die 124 by other methods in further embodiments.

Where multiple semiconductor die 124 are included, the semiconductor die 124 may be stacked atop each other in an offset stepped configuration to form a die stack 140 as shown for example in FIG. 8. The number of die 124 in stack 140 in FIGS. 8-11 is by way of example only, and embodiments may include different numbers of semiconductor die in stack 140, including for example 1, 2, 4, 8, 16, 32 or 64 die. There may be other numbers of die in further embodiments. There may be more than one die stack 140, with alternating stacks stepped in opposite directions. In such an embodiment, an interposer layer (not shown) may be provided between the stacks to electrically connect the die bond pads of adjacent die stacks. FIG. 16, explained below, shows a further embodiment with two separate die stacks facing each other on the substrate 102.

The die may be affixed to the substrate and/or each other using a die attach film. As one example, the die attach film may be cured to a B-stage to preliminarily affix the die 124 in the stack 140, and subsequently cured to a final C-stage to permanently affix the die 124 in the stack 140.

Figure 9:
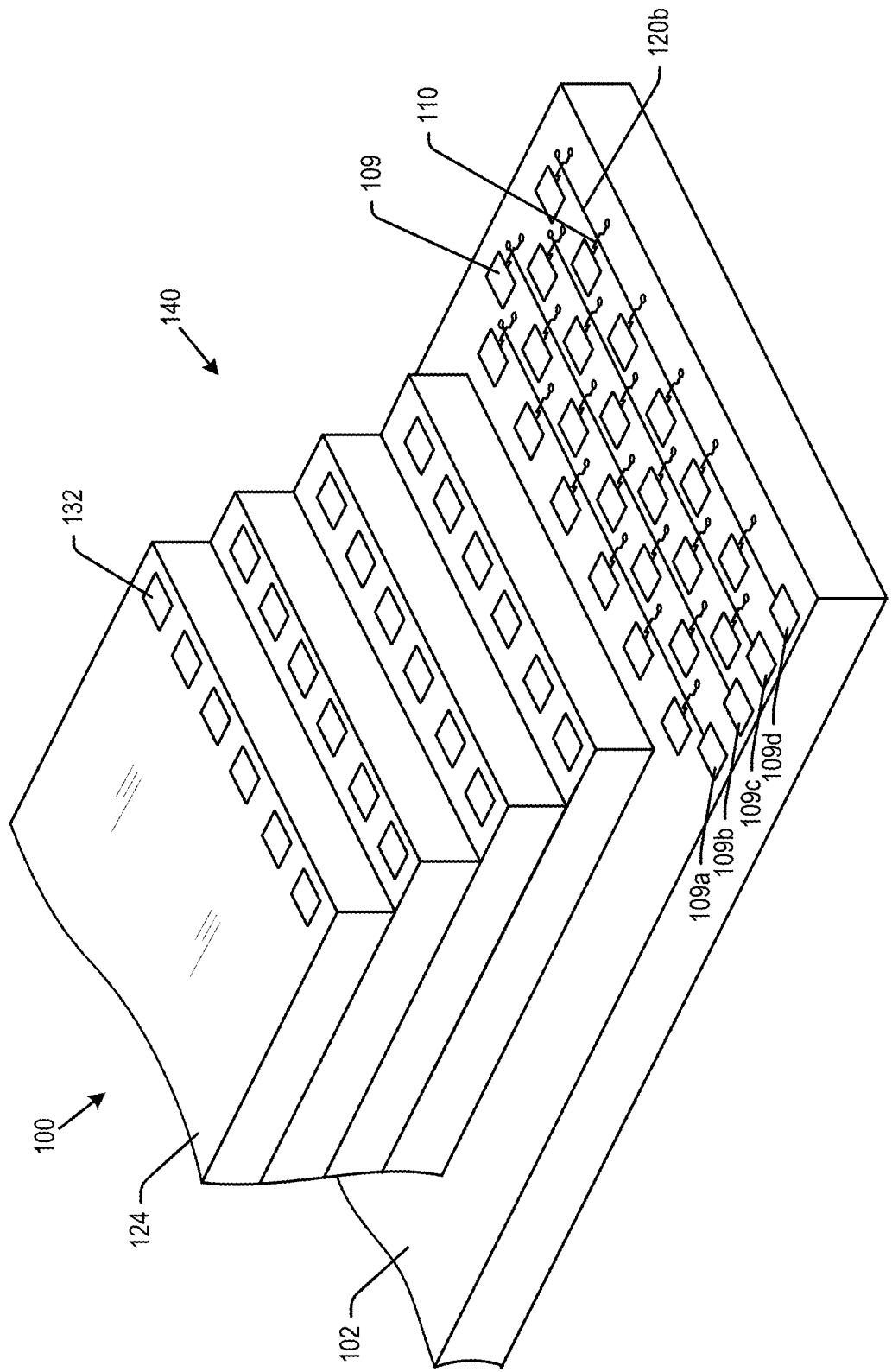
FIG. 9 is a perspective view of a number of semiconductor die mounted on a substrate and showing the control switches according to an embodiment of the present technology.

In step 224, the semiconductor die in the die stack 140 may be electrically connected to each other and to the substrate 102. In accordance with aspects of the present technology, each contact pad 132 on each semiconductor die 124 in stack 140 is separately wire bonded to a corresponding contact pad 109 on the substrate 102. FIG. 9 shows a perspective view of an embodiment of a semiconductor device 100 including four semiconductor die 124 in a stack 140. As mentioned, four die are shown by way of example and the die stack 140 may include more or less die in further embodiments.

As shown in FIG. 9, there is a separate contact pad 109 on substrate 102 for each die bond pad 132 in the die stack 140, and each contact pad 109 includes an associated control switch 110. As noted, each control switch 110 is shown with a first I/O pin (on one side of the switch) connected to a contact pad 109, and a second I/O pin (on the opposite side of the switch) terminating at a via that is routed through the substrate 102 to a controller die explained below. Each row of control switches 110 also has a control trace 120b, described above, running through the control switches in the row. Each row of control traces 120b is affixed at one end to a control trace contact pad 109a, 109b, 109c, 109d. The control trace contact pads 109a-d are in turn electrically connected to the controller die by wire bond as explained below. As an alternative to the control trace contact pads 109a-d, the respective control traces 120b may be routed through the substrate 102 to different solder ball connections on contact pads 108 on a lower surface of the substrate 102. These solder ball connections would in turn be electrically connected to the controller die.

Figure 10:
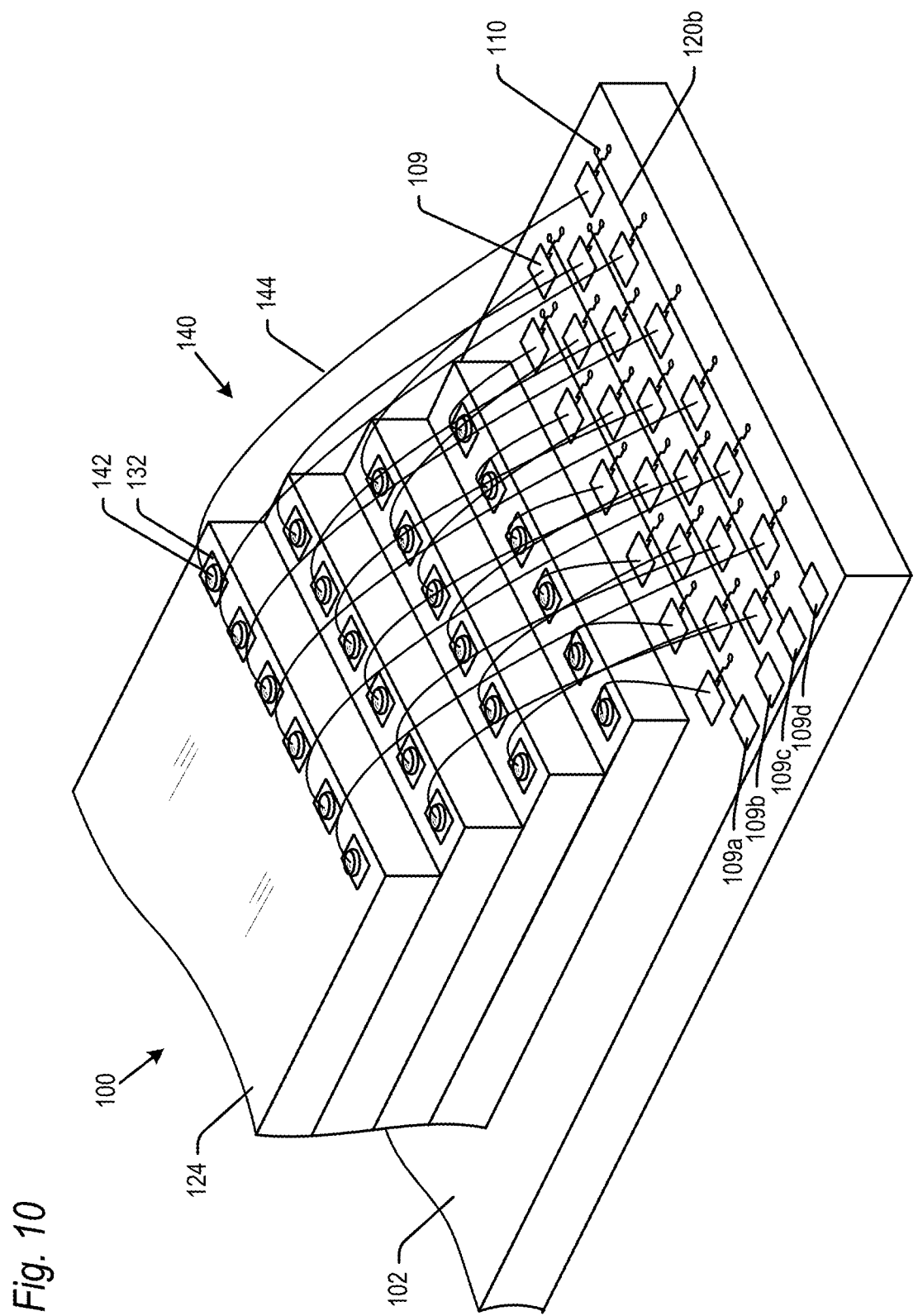
FIG. 10 is a perspective view similar to FIG. 9 but further showing the individual wire bonds formed to wire bond the semiconductor die to the substrate according to an embodiment of the present technology.
Figure 11:
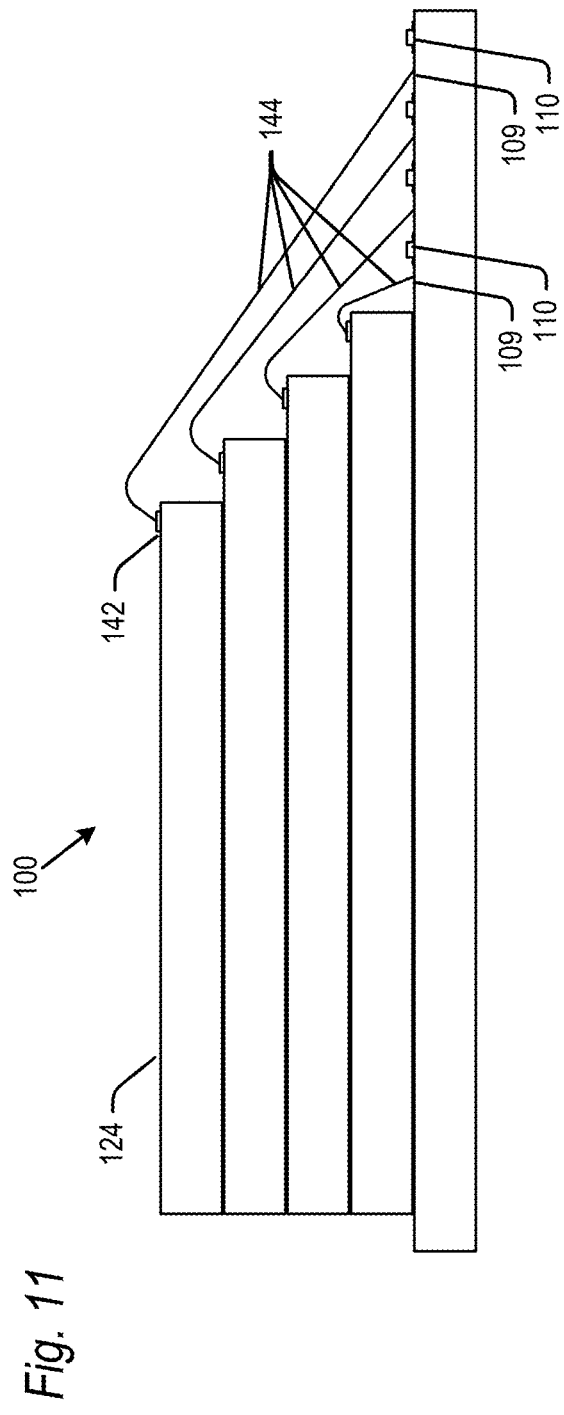
FIG. 11 is a side view similar to FIG. 9 but further showing the individual wire bonds formed to wire bond the semiconductor die to the substrate according to an embodiment of the present technology.

The semiconductor device 100 of FIG. 9 may be wire bonded as shown in the perspective view of FIG. 10 and the edge view of FIG. 11. In general, conductive bumps 142 may be deposited on the die bond pads 132 by a wire bond capillary (not shown). The wire bond capillary may form a molten ball at the tip of a wire within the wire bond capillary by electronic flame off (EFO). The molten ball may then be pressed onto a die bond pad 132 using an elevated temperature and ultrasonic oscillation and left behind to form a conductive bump 142. The wire bond capillary may then pay out wire to electrically connect a conductive bump 142 (and the die bond pad 132 on which it is formed) to a contact pad 109 on the substrate 102 to form the independent wire bonds 144 shown in FIGS. 10 and 11.

As shown in FIG. 10, the wire bonds 144 electrically connect each die bond pad 132 to a respective contact pad 109. The die bond pads 132 on the lowermost die 124 in the stack may be wire bonded to a first row of contact pads 109 on the substrate. Then the die bond pads 132 on the next adjacent die 124 in the stack may be wire bonded to a next row of contact pads 109, and so on until the contact pads 132 on all die in stack 140 are wire bonded to contact pads 109 on the substrate 102.

In the embodiments shown in FIGS. 9-11, there is a separate row of contact pads 109 for each semiconductor die 124 in the stack 140. However, as noted, the contact pads 109 and control switches 110 on the substrate 102 may be provided in any of a wide variety of patterns (and not necessarily in the straight rows, one row per die, shown in FIGS. 9 and 10). However, in embodiments, all contact pads 109 wire bonded to the same die 124 will have control switches 110 connected to a single, common control trace 120b passing through the control switches 110. Each such control trace 120b may terminate at a control trace contact pad 109a-d.

Thus, regardless of arrangement of contact pads 109 and control switches 110, all die bond pads on the lowermost die may be connected to substrate contact pads having associated control switches that are connected for example to control trace contact pad 109a. All die bond pads on the next adjacent die may be connected to substrate contact pads having associated control switches connected for example to control trace contact pad 109b. All die bond pads on the next adjacent die may be connected to substrate contact pads having associated control switches connected for example to control trace contact pad 109c. And all die bond pads on the next adjacent (top) die may be connected to substrate contact pads having associated control switches connected for example to control trace contact pad 109d.

Figure 12:
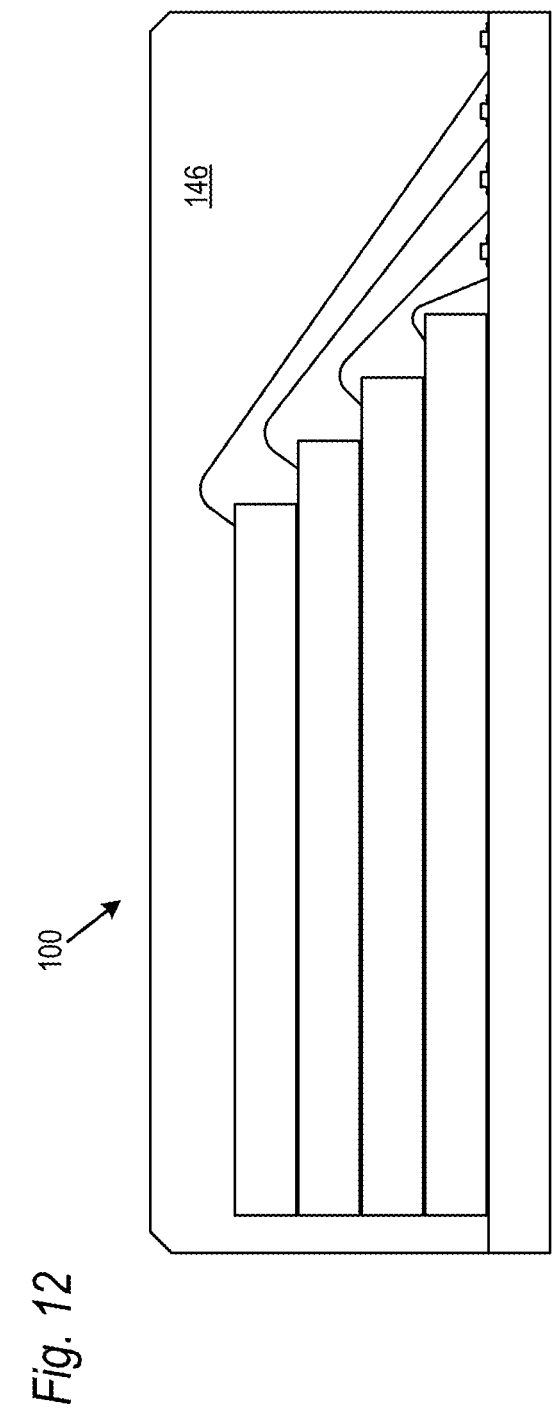
FIG. 12 is a side view of a completed semiconductor device according to an embodiment of the present technology.

Following electrical connection of the die 124 to the substrate 102 by the wire bonds 144, the semiconductor device 100 may be encapsulated in a mold compound 146 in a step 234 and as shown in FIG. 12. The semiconductor device may be placed within a mold chase (not shown) comprising upper and lower mold plates. Molten mold compound 146 may then be injected into the mold chase to encase the components of the semiconductor device 100 in a protective enclosure in for example a compression molding process. Mold compound 146 may include for example solid epoxy resin, Phenol resin, fused silica, crystalline silica, carbon black and/or metal hydroxide. Other mold compounds from other manufacturers are contemplated. The mold compound may be applied according to other known processes, including by FFT (flow free thin) molding, transfer molding or injection molding techniques.

In embodiments where the semiconductor device 100 is to be permanently affixed to a host device such as a printed circuit board (PCB), solder balls (not shown) may be affixed to the contact pads 108 on a lower surface of substrate 102 of the device 100 in step 236. The solder balls 144 may be omitted in embodiments where the semiconductor device 100 is to be used as an LGA (land grid array) semiconductor package.

As noted above, the semiconductor device 100 may be formed on a panel of substrates. After formation and encapsulation of the devices 100, the devices 100 may be singulated from each other in step 240 to form a finished semiconductor device 100 as shown in FIG. 12. The semiconductor devices 100 may be singulated by any of a variety of cutting methods including sawing, water jet cutting, laser cutting, water guided laser cutting, dry media cutting, and diamond coating wire cutting. While straight line cuts will define generally rectangular or square shaped semiconductor devices 100, it is understood that semiconductor device 100 may have shapes other than rectangular and square in further embodiments of the present technology.

Operation of embodiments of the present technology will now be explained with reference to the circuit diagram of FIG. 13. The contact pads 109 and electrical traces on the substrate 102 may be electrically connected to a controller die 150 such as an ASIC. The controller die 150 may be mounted on the substrate 102, or mounted on a host device (such as a PCB) to which the semiconductor device 100 is also affixed. The controller 150 sends signals to and receives signals from respective die bond pads 132 on the die 124 in the stack 140.

In order to send/receive a signal to/from a particular die bond pad 132 on a particular die, the controller 150 will enable that die in the die stack, by closing the control switches 110 to that die, and then the I/O signal is sent to/from the selected die bond pad of the enabled die. In accordance with the present technology, no voltage flows to other, non-enabled die in the die stack as result of control switches 110 associated with the non-enabled die being open. This reduces or prevents parasitic pin cap, and allows an accompanying reduction in power consumption and an increase I/O signal transfer speed. The present technology also scales to a large number of die in die stack 140 without an accompanying increase in pin cap.

Figure 13:
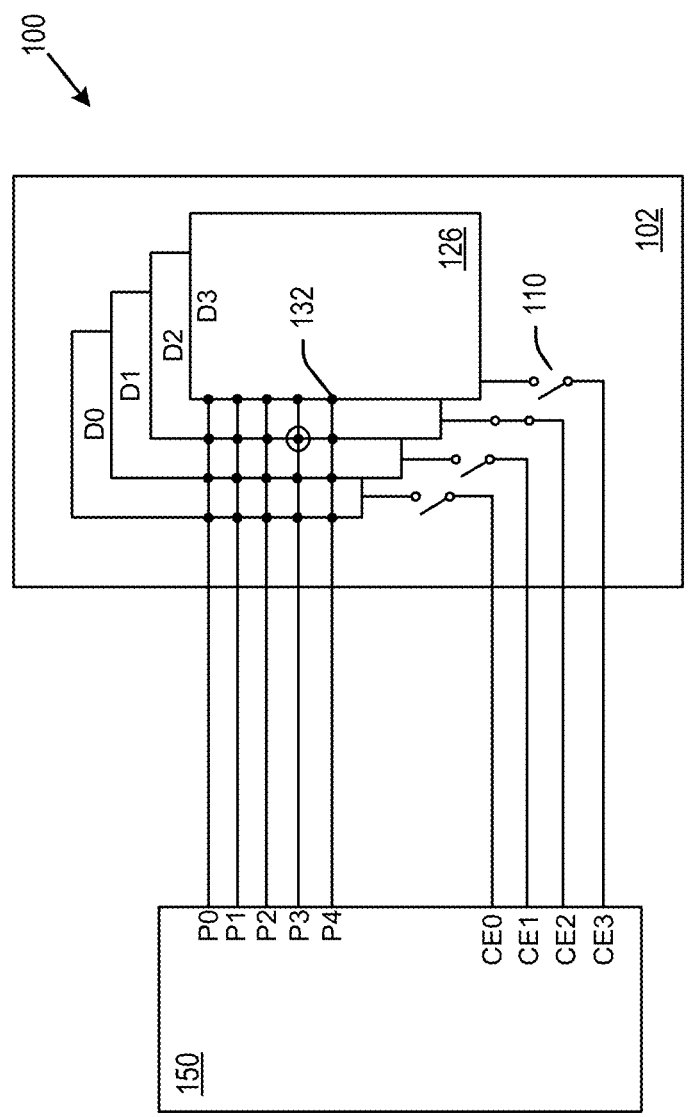
FIG. 13 is a circuit diagram illustrating the operation of an embodiment of the present technology.

As an example shown in the diagram of FIG. 13, assume that the controller accesses a die bond pad 132 corresponding to pin P3 on die D2 (circled in FIG. 13). The controller 150 will send a chip enable signal over line CE2. Line CE2 is coupled to a control trace contact pad 109 (for example, 109c in FIG. 10). The chip enable signal will travel along the control trace 120b connected to control trace contact pad 109c to close all of the control switches 110 electrically coupled by wire bonds 144 to die D2. The controller may then send/receive an I/O signal over pin P3 coupled by a wire bond 144 to the selected die bond pad on die D2. As no voltages travel along the other chip enable lines (CE0, CE1 and CE3 in this example), the control switches connected to those chip enable lines remain open. The layout and selected die bond pad shown in FIG. 13 are by way of example only and may vary greatly while embodying the operating principles described above.

Figure 14:
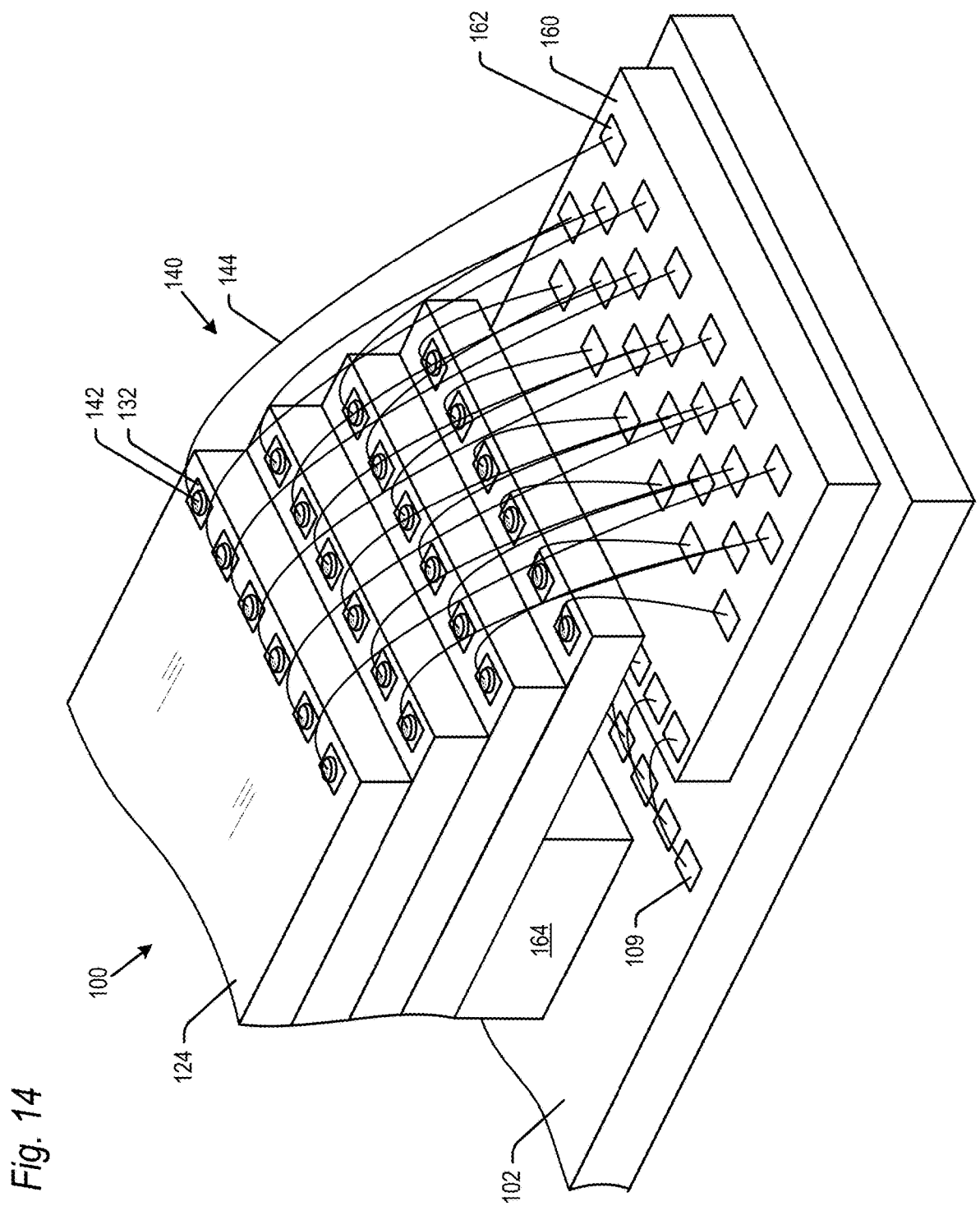
FIG. 14 is a perspective view of an alternative embodiment of the present technology including control switches integrated into an interface chip.

In embodiments described above, the control switches 110 were formed as MEMS devices on the substrate 102. In further embodiments, the control switches may be configured as integrated circuits within a semiconductor die. An example of such an embodiment is shown in FIG. 14. FIG. 14 includes an interface chip 160 mounted on the surface of substrate 102. Interface chip 160 includes die bond pads 162, one die bond pad 162 for each of the die bond pads 132 in the die each stack 140. Each die bond pad 132 may be wire bonded to respective die bond pads 162 using wire bonds 144 as described above.

The die stack 140 may be supported over the substrate 102 on a spacer 164. The spacer 164 has a thickness above the substrate that is greater than a thickness of the interface chip 160 so that wire bonds may be formed between the interface chip 160 and the substrate 102, off a trailing edge of the interface chip 160 beneath the die stack 140 as shown. It is understood that the interface chip 160 may be wire bonded to the substrate 102 with wire bonds off of various edges of the interface chip 160, including off of the leading edge of the interface chip 160 opposite the trailing edge. In further embodiments, the interface chip 160 may be formed with solder balls on a lower surface of the chip (not shown) so that the interface chip may be physically and electrically coupled to the substrate in a flip-chip attachment.

Figure 15:
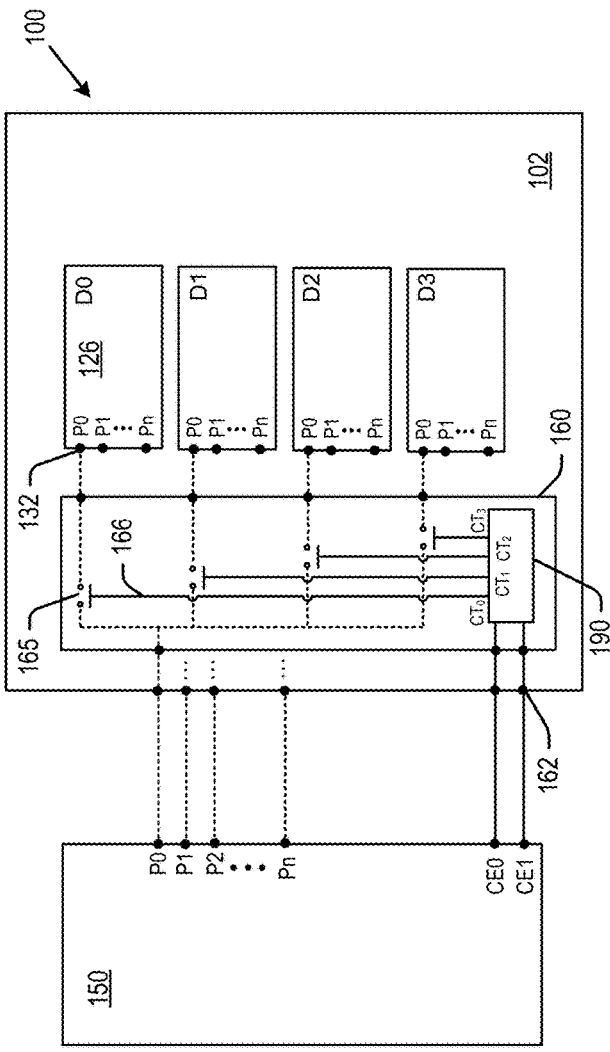
FIG. 15 is a circuit diagram illustrating the operation of the embodiment of FIG. 14.

FIG. 15 is a circuit diagram illustrating operation of an embodiment including an interface chip 160. The embodiment of FIG. 15 shows four semiconductor die 126 numbered D0, D1, D2 and D3. Each semiconductor die includes n die bond pads 132 having pin numbers P0, P1, . . . , Pn. These pins connect via I/O traces (shown with dashed lines) to pins P0, P1, . . . , Pn on the controller die 150. For ease of explanation, only a single set of I/O traces are shown on substrate 102—those connected to Pin P0. However, it is understood that each pin from each die may also have I/O traces connecting them to the controller die, together with a set of integrated circuit control switches 165 as explained below.

The interface chip 160 may include control switches 165 fabricated as integrated circuits within the interface chip 160, as well as control traces 166 associated with each of the control switches 165. The integrated circuit control switches 165, together with the control traces 166, may operate to enable a single die in the die stack 140 while preventing voltages from traveling to the die bond pads of non-enabled die in the stack 140 as described above. In particular, chip enable signals from the controller may pass through the interface chip 160 to enable a single semiconductor die. In the embodiment shown, the interface chip 160 may further include a switch decoder circuit 190 as explained below, which enables one of the control traces 166 ($CT_0$, $CT_1$, $CT_2$ or $CT_3$) using less chip enable pins (CE0, CE1). However, in further embodiments, the switch decoder circuit 190 may be omitted and there may be as many chip enable pins as there are control traces.

In order to transmit a signal to/from a particular die bond pad 132 on a particular die, the controller 150 will enable that die in the die stack, by sending a chip enable signal to the interface chip 160. The interface chip 160 will in turn generate a voltage on the designated control trace 166, which will in turn close all of the control switches 165 associated with the selected die. The control traces for the other, idle die receive no voltages, so those control switches associated with those idle die remain open. Thus, no voltage flows to the other, non-enabled die in the die stack as result of the operation of the interface chip. This reduces or prevents parasitic pin cap, and allows an accompanying reduction in power consumption and an increase I/O signal transfer speed.

As noted, the I/O traces and associated control switch 165 are shown for only a single pin (P0) on each die. However, each die would have an I/O trace and associated control switch 165 for each pin on the die. The set of control switches 165 for die D0 would be activated (i.e., closed) by control trace $CT_0$. The set of control switches 165 for die D1 would be activated by control trace $CT_1$. The set of control switches for die D2 would be activated by control trace $CT_2$. And the set of control switches 165 for die D3 would be activated by control trace $CT_3$. As noted above, there may be more or less die in further embodiments.

FIG. 16 is an edge view of an embodiment similar to that shown in FIG. 14 including an interface chip 160. In the embodiment of FIG. 16, a second die stack 170, mirroring the first die stack 140, may be mounted on the substrate 102. The second die stack 170 may be wire bonded to the interface chip 160 as described above with respect to die stack 140. In this embodiment, the interface chip may include enough die bond pads 162 for each of the die bond pads 132 in the die stacks 140 and 170. The die stack 140 may be supported over the substrate with a first spacer 164 (as described above) and a second spacer 174 supporting the die stack 140 on the interface chip 160. The die stack 170 may similarly be supported using first and second spacers 164, 174. The embodiment shown in FIG. 14 may similarly include a second spacer 174 supporting a leading edge of the die stack 140 on top of the interface chip 160.

It is further understood that the embodiment of FIG. 11, including a single die stack 140 and MEMS control switches 110 may include a second die stack 170 as shown in FIG. 16 (without the interface chip 160). In such an embodiment, there may be one MEMS control switch 110 as described above for each of the die bond pads 132 in stacks 140 and 170 together. Such an embodiment may be fabricated with or without spacers 164, 174.

Figure 17:
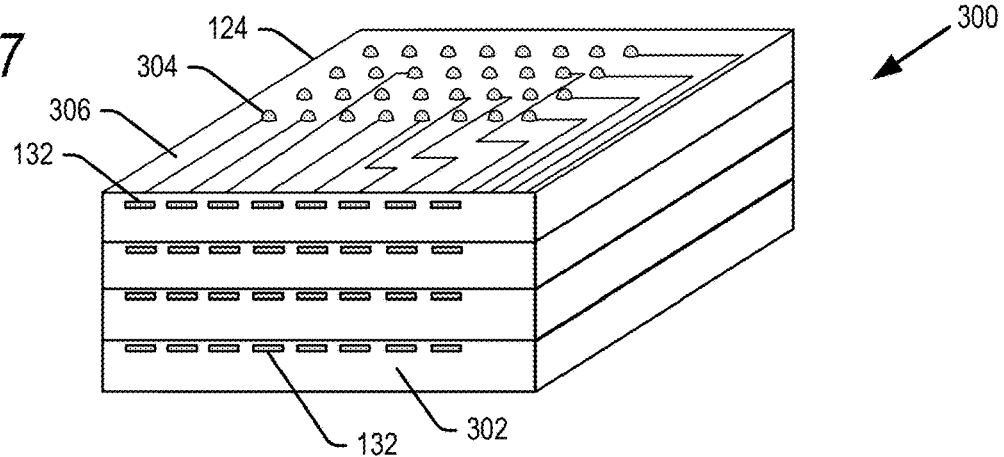
FIGS. 17-22 are perspective views showing further alternative embodiments of the present technology comprising a block of semiconductor die with control switches in an exposed edge of the block.

In embodiments described above, MEMS control switches were formed on the substrate of a wire bonded semiconductor device 100. Further embodiments of a semiconductor device according to the present technology may be fabricated as a semiconductor cube, without a substrate or wire bonds. Such an embodiment will now be described with reference to FIGS. 17-22. FIG. 17 illustrates a semiconductor device 300 including a plurality of semiconductor die 124 stacked on top of each other. The die bond pads 132 of each die may be exposed at an edge surface 302 of the device. The illustrated examples shows four die 124 in the device 300, but the number of die 124 in the semiconductor device 300 may be greater than or less than four. Solder balls 304 may be formed on an upper surface of the semiconductor device 300 for electrical connection to a host device such as a PCB including a controller.

FIG. 17 further shows a redistribution layer 306 formed on the upper surface of the semiconductor device 300. The redistribution layer 306 may comprise a passivation layer covering the upper surface of the uppermost semiconductor die 124 in the die stack, and a conductance pattern formed on the passivation layer. As explained below, the redistribution layer is used to electrically connect the I/O pins of the control switches formed on surface 302 to the solder balls 304, and to electrically control traces formed on surface 302 to the solder balls. Only portions of the conductance pattern of the redistribution layer are shown, and the portions shown are by way of example only and may vary in further embodiments.

Figure 18:
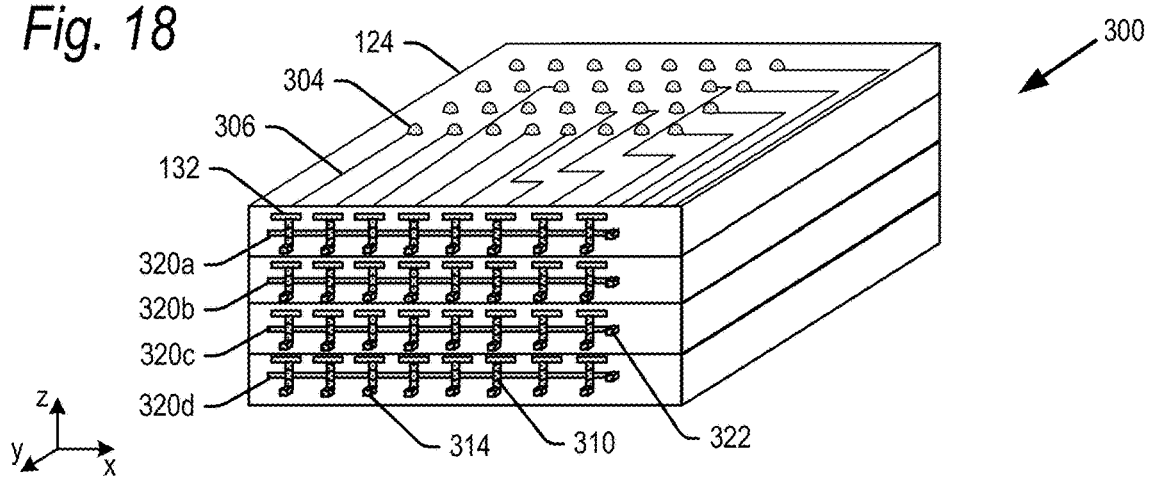

FIG. 18 illustrates a number of MEMS control switches 310 formed on the exposed edge surface 302, one control switch 310 for each die bond pad 132 at the exposed edge 302. FIG. 18 further shows control traces 320a, 320b, 320c and 320d, with each control trace running through each of the control switches on separate semiconductor die. The control switches and control traces may for example be formed according to the steps described above in the flowchart of FIG. 4, and may look like the MEMS control switches 110 shown for example in FIGS. 5F and 5G (though they may look differently in further embodiments). Each control traces 320a-d may terminate in at control trace pin 322, extending vertically away from the surface 302 in the y-direction. In embodiments, one side of each control switch 310 includes an I/O pin that is electrically coupled to its associated die bond pad 132. The other side of the switch may comprise an I/O pin 314 extending perpendicularly away from the exposed edge 302 in the y-direction.

Figure 19:
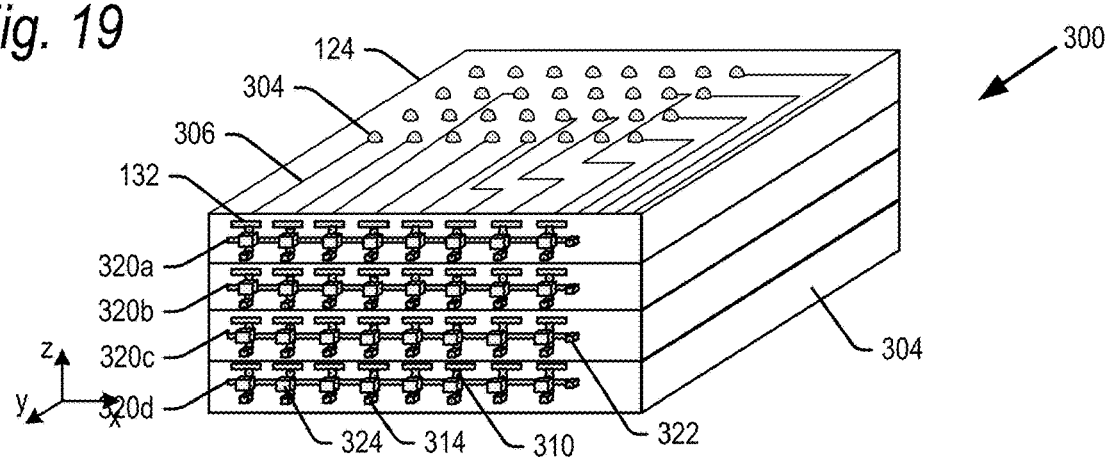

After the control switches 310 and control traces 320 are formed, the cantilevered portions of the control switches 310 may be encased in covers 324 as shown in FIG. 19. The covers 136 may be formed of an electrically insulative material, such as for example silicon, silicon dioxide or some other dielectric material. The I/O pins connected to the die bond pads and the I/O pins 314 may extend outside of the covers 136.

Figure 20:
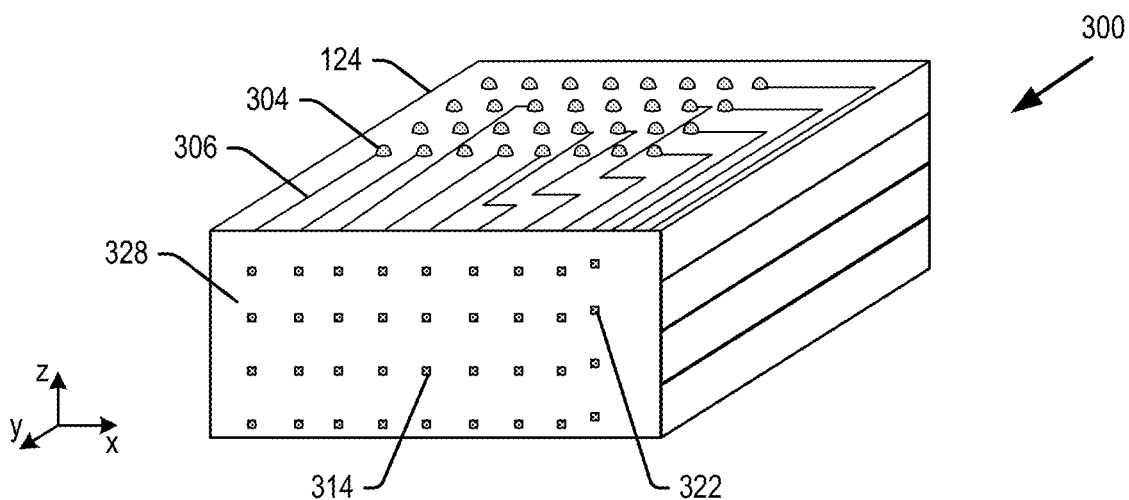

After the control switches and control traces are formed, a dielectric layer 328 may be formed on the edge surface 302 as shown in FIG. 20. The dielectric layer covers the control switches 310, except for the I/O pins 314 and the control trace pins 322, which may be exposed through the surface of the dielectric layer 328. The covers 136 protect the cantilevered portions of the control switches buried within the dielectric layer 328, and allow those portions to move to open and close the control switches under control of a voltage through the control traces 320a-d as explained above.

Figure 21:
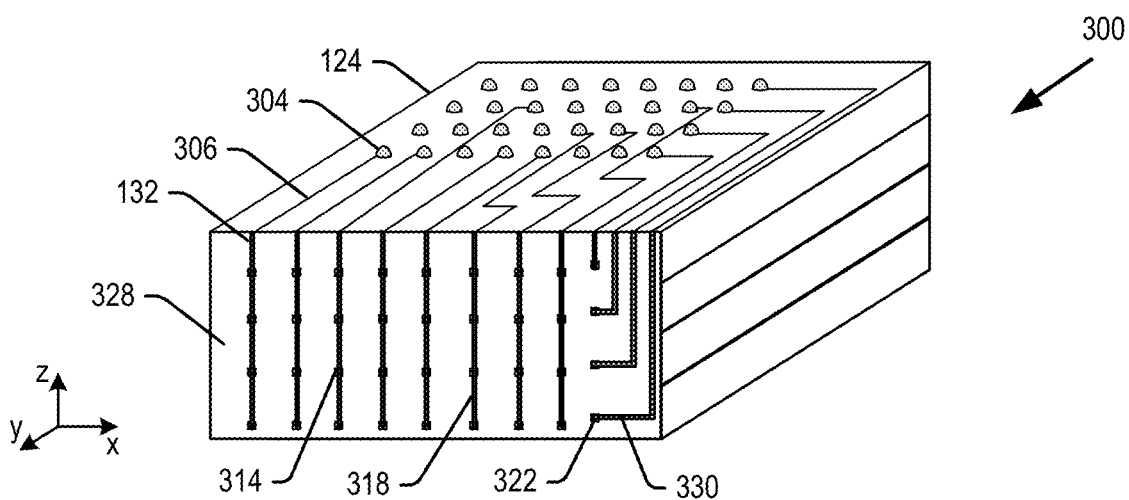

As shown in FIG. 21, a conductive layer may then be formed on top of the dielectric layer, which conductive layer is etched or otherwise formed by photolithography methods into a conductance pattern on the edge surface 302. The conductance pattern includes I/O traces 318 which electrically connect the I/O pins 314 to traces of the redistribution layer on the upper surface of the device 300. Thus, each die bond pad 132 on each die is coupled to the solder balls 304 by the control switches and I/O traces 318. The conductance pattern further includes external control traces 330 connected to respective ones of the control trace pins 322. The external control traces 330 connect the control trace pins 322 and control traces 320a-d to traces in the redistribution layer 306, which are in turn coupled to solder balls 304.

As explained above, a voltage along a control trace 320 (via an external control trace 330) will cause all of the control switches 310 associated with a given semiconductor die 124 to close, thereby enabling that semiconductor die. Thus, for example a voltage along the outermost external control trace 330 (labeled) and associated control trace 320d will enable the fourth (or lowermost) semiconductor die in the die stack. No voltage would be supplied to the other control traces 320a, 320b or 320c. Thus, the control switches 310 associated with those control traces would remain open. Consequently, the die bond pads 132 associated with those control switches 310 would receive no voltage, thus avoiding pin cap.

The semiconductor device 300 may operate as described above with respect to the circuit diagram of FIG. 13. In particular, the semiconductor device 300 may be mounted to a PCB together with a controller die such as an ASIC. The controller die may send a chip enable signal which couples to one of the control traces 320a, 320b, 320c or 320d, thus enabling the semiconductor die associated with the control trace receiving the voltage. The controller may then send/receive a signal to/from a selected I/O pin on the enabled die via the I/O traces 318 and the I/O pins 314. The die bond pads of non-enabled semiconductor die do not receive a voltage, and pin cap is minimized. In the embodiment shown in FIGS. 17-21, the control switches 310 are formed on an edge surface 302 and the solder balls 304 are formed on an upper surface of the top die 124.

Figure 22:
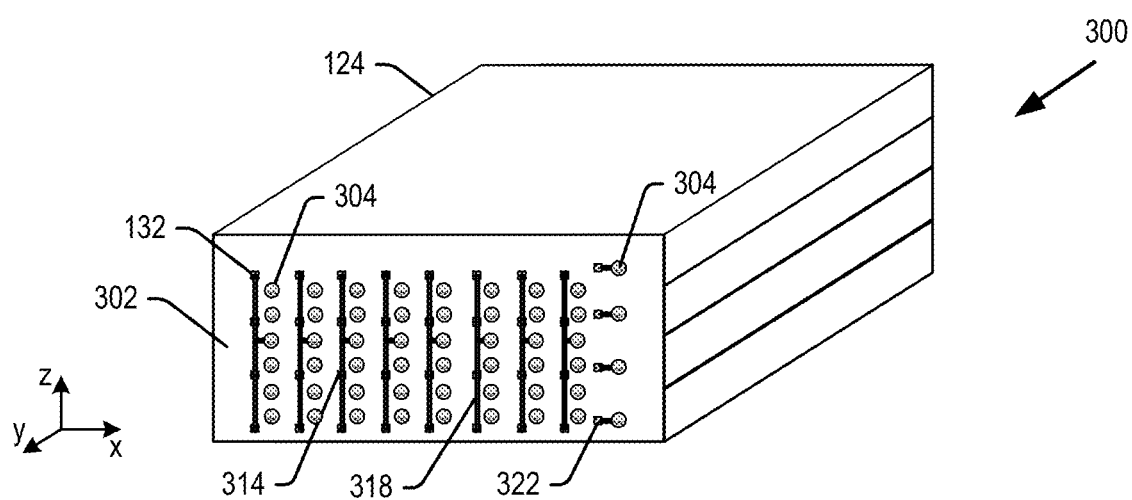

In a further embodiment shown in FIG. 22, the solder balls 304 may also be formed on the edge surface 302 together with the control switches 310 and control trace pins 322. In this embodiment, the control switches 310 may be fabricated as described above. In this embodiment, each column of I/O traces 318 may have an associated (I/O) solder ball 304. Each control trace pin 322 may have an associated (control) solder ball 304. Voltages to one of the I/O solder balls 304 and one of the control solder balls 304 may enable a single pin on a single die as described above. Solder balls may be provided in a ball grid pattern as shown. Some solder balls in addition to the I/O solder balls may be provided for other electrical connections between the device 300 and the host device on which the device 300 is mounted. Other solder balls may be dummy solder balls.

In each of the embodiments described above, there may be the same number of chip enable pins in the controller die as there are semiconductor die 124 in the die stack. Embodiments including four die may have four chip enable pins. Embodiments including eight die may have eight chip enable pins. And so on. In a further embodiment, the controller 150 or interface chip 160 (FIG. 15) may utilize a switch decoder circuit 190 (FIG. 15) which only requires n bits, where $2^n$=the number of die in the semiconductor device. These n bits may be carried over n chip enable pins from the controller. Thus, for example, as shown in FIG. 15, a semiconductor device 100 including four semiconductor die 124 may be served by a controller including two chip enable pins (CE0, CE1). A semiconductor device including eight semiconductor die 124 may be served by a controller including three chip enable pins. The n bits may be carried over the n chip enable pins and traces to the switch decoder circuit 190, which decodes the n bits and determines which semiconductor die in the device 100, 300 is to be enabled.

In summary, in one example, the present technology relates to a semiconductor device, comprising: a plurality of semiconductor stacked die, each semiconductor die of the plurality of semiconductor die comprising a plurality of die bond pads; and a plurality of control switches, the plurality of control switches comprising: a first group of control switches electrically connected to a first semiconductor die of the plurality of semiconductor die, a first control trace associated with the first group of control switches such that each control switch in the first group of control switches is either open or closed, depending upon whether a voltage passes through the first control trace, a second group of control switches electrically connected to a second semiconductor die of the plurality of semiconductor die, and a second control trace associated with the second group of control switches such that each control switch in the second group of control switches is either open or closed, depending upon whether a voltage passes through the second control trace.

In a further example, the present technology relates to a semiconductor device, comprising: a substrate comprising a plurality of contact pads, the plurality of contact pads comprising a first group of contact pads and a second group of contact pads; a plurality of semiconductor die stacked on the substrate, a first semiconductor die electrically coupled to the first group of contact pads and a second semiconductor die electrically coupled to the second group of contact pads; a plurality of control switches on the substrate, the plurality of control switches comprising a first group of control switches associated with the first group of contact pads, and a second group of control switches associated with the second group of contact pads; and a plurality of control traces, the plurality of control traces comprising a first control trace on the substrate associated with the first group of control switches and a second control trace on the substrate associated with the second group of control switches.

In another example, the present technology relates to a semiconductor device operating under control of a controller die, comprising: a substrate comprising a plurality of contact pads, the plurality of contact pads comprising a first group of contact pads and a second group of contact pads; a plurality of semiconductor die stacked on the substrate; a plurality of wire bonds, a first group of wire bonds electrically coupling a first semiconductor die electrically to the first group of contact pads and a second group of wire bonds electrically coupling a semiconductor die to the second group of contact pads; a plurality of control switches on the substrate, the plurality of control switches comprising a first group of control switches associated with the first group of contact pads, and a second group of control switches associated with the second group of contact pads; and a plurality of control traces, the plurality of control traces comprising a first control trace on the substrate associated with the first group of control switches and a second control trace associated with the second group of control switches, the first and second control traces configured to receive a chip enable signal from the controller at different times, receipt of the chip enable signal in the first control trace closing the first group of control switches and enabling the first semiconductor die while the second group of control switches remain open.

In a further example, the present technology relates to a semiconductor device, comprising: substrate means comprising a plurality of contact pads, the plurality of contact pads comprising a first group of contact pads and a second group of contact pads; a plurality of semiconductor die stacked on the substrate means, a first semiconductor die electrically coupled to the first group of contact pads and a second semiconductor die electrically coupled to the second group of contact pads; signal switching means on the substrate means, the signal switching means comprising a first group of signal switching means associated with the first group of contact pads, and a second group of signal switching means associated with the second group of contact pads; and signal switching control means, the signal switching control means comprising first signal switching control means associated with the first group of signal switching means and a second signal switching control means associated with the second group of signal switching means.

The foregoing detailed description of the technology has been presented for purposes of illustration and description. It is not intended to be exhaustive or to limit the technology to the precise form disclosed. Many modifications and variations are possible in light of the above teaching. The described embodiments were chosen in order to best explain the principles of the technology and its practical application to thereby enable others skilled in the art to best utilize the technology in various embodiments and with various modifications as are suited to the particular use contemplated. It is intended that the scope of the technology be defined by the claims appended hereto.

We claim:

1. A semiconductor device, comprising:
   a plurality of semiconductor stacked die, each semiconductor die of the plurality of semiconductor die comprising a plurality of die bond pads; and
   a substrate, comprising:
   a plurality of contact pads, one contact pad for each of the plurality of die bond pads from each of the plurality of semiconductor die; and
   a plurality of control switches in the substrate, the plurality of control switches comprising:

a first group of control switches electrically connected to a first semiconductor die of the plurality of semiconductor die, each of the control switches in the first group physically connected to a contact pad of the plurality of contact pads, and electrically connected to a die bond pad of the plurality of die bond pads of the first semiconductor die, a first control trace associated with the first group of control switches such that each control switch in the first group of control switches is either open or closed, depending upon whether a first voltage passes through the first control trace, and signal transfer to/from the first semiconductor die is blocked when the first group of control switches are open, a second group of control switches electrically connected to a second semiconductor die of the plurality of semiconductor die, each of the control switches in the second group physically connected to a contact pad of the plurality of contact pads, and electrically connected to a die bond pad of the plurality of die bond pads of the second semiconductor die, and a second control trace associated with the second group of control switches such that each control switch in the second group of control switches is either open or closed, depending upon whether a second voltage passes through the second control trace, and signal transfer to/from the second semiconductor die is blocked when the second group of control switches are open.

2. The semiconductor device of claim 1, wherein the plurality of control switches are micro-electromechanical control switches.

3. The semiconductor device of claim 1, wherein the plurality of control switches are integrated circuit control switches.

4. The semiconductor device of claim 1, wherein the plurality of control switches are open in the absence of the first and second voltages through the first and second control traces, the first voltage through the first control trace closes the first group of control switches.

5. The semiconductor device of claim 1, further comprising the substrate, the plurality of semiconductor die supported on the substrate, the substrate comprising the plurality of contact pads, the plurality of control switches comprising micro-electromechanical switches on the substrate.

6. The semiconductor device of claim 5, further comprising a plurality of wire bonds, each wire bond of the plurality of wire bonds extending between a contact pad of the plurality of contact pads and a respective die bond pad on a respective semiconductor die.

7. The semiconductor device of claim 5, wherein each of the plurality of contact pads has an associated control switch of the plurality of control switches.

8. The semiconductor device of claim 5, the plurality of contact pads comprising a first row of contact pads associated with the first group of control switches, the first group of control switches arranged in a second row, and the plurality of contact pads comprising a third row of contact pads associated with the second group of control switches, the second group of control switches arranged in a fourth row.

9. The semiconductor device of claim 8, the second row further comprising the first control trace, and the fourth row further comprising the second control trace.

10. The semiconductor device of claim 1, wherein the plurality of semiconductor die are flash memory die.

11. A semiconductor device, comprising:
a substrate comprising a plurality of contact pads, the plurality of contact pads comprising a first group of contact pads and a second group of contact pads;
a plurality of semiconductor die stacked on the substrate, a first semiconductor die electrically coupled to the first group of contact pads and a second semiconductor die electrically coupled to the second group of contact pads;
a plurality of control switches fabricated in the substrate, the plurality of control switches comprising a first group of control switches, each contact pad of the first group of contact pads being physically connected to a single control switch from the first group of control switches, and a second group of control switches, each contact pad of the second group of contact pads being physically connected to a single control switch from the second group of control switches; and
a plurality of control traces, the plurality of control traces comprising a first control trace on the substrate associated with the first group of control switches and a second control trace on the substrate associated with the second group of control switches.

12. The semiconductor device of claim 11, wherein the plurality of control switches are micro-electromechanical control switches.

13. The semiconductor device of claim 11, wherein the first control trace is configured to open or close the first group of control switches depending on a first voltage through the first control trace.

14. The semiconductor device of claim 13, wherein each control switch of the first group of control switches includes a cantilevered portion moving between a first position where the first group of control switches is open, and a second position where the first group of control switches is closed, the cantilevered portion moving between the first and second positions based on whether the first voltage is applied to the first control trace.

15. The semiconductor device of claim 11, further comprising a plurality of wire bonds, each wire bond of the plurality of wire bonds extending between a contact pad of the plurality of contact pads and a respective die bond pad on a respective semiconductor die.

16. A semiconductor device operating under control of a controller die, comprising:
a substrate comprising a plurality of contact pads, the plurality of contact pads comprising a first group of contact pads and a second group of contact pads;
a plurality of semiconductor die stacked on the substrate, the plurality of semiconductor die comprising:
a first semiconductor die comprising a first plurality of die bond pads, one die bond pad in the first plurality of die bond pads for each of the contact pads in the first group of contact pads, and
a second semiconductor die comprising a second plurality of die bond pads, one die bond pad in the second plurality of die bond pads for each of the contact pads in the second group of contact pads;
a plurality of wire bonds, a first group of wire bonds electrically coupling the first plurality of die bond pads of the first semiconductor die to the first group of contact pads and a second group of wire bonds electrically coupling the second plurality of die bond pads of the second semiconductor die to the second group of contact pads;

a plurality of control switches in the substrate, the plurality of control switches comprising a first group of control switches attached to the first group of contact pads such that each contact pad of the first group of contact pads is physically connected to a single control switch from the first group of control switches, and a second group of control switches attached to the second group of contact pads such that each contact pad of the second group of contact pads is physically connected to a single control switch from the second group of control switches; and a plurality of control traces, the plurality of control traces comprising a first control trace on the substrate associated with the first group of control switches and a second control trace associated with the second group of control switches, the first and second control traces configured to receive a chip enable signal from the controller die at different times, receipt of the chip enable signal in the first control trace closing the first group of control switches and enabling the first semiconductor die while the second group of control switches remain open, blocking signal transfer to/from the second semiconductor die.

17. The semiconductor device of claim 16, wherein all wire bonds of the plurality of wire bonds are between a die bond pad of a semiconductor die and a contact pad on the substrate.

18. The semiconductor device of claim 16, wherein the plurality of contact pads comprise at least as many contact pads as there are die bond pads associated with the wire bonds.

19. The semiconductor device of claim 16, wherein the plurality of control switches comprise at least as many control switches as there are die bond pads associated with the wire bonds.

* * * * *